US008602814B2

(12) United States Patent
Packard, III et al.

(10) Patent No.: US 8,602,814 B2
(45) Date of Patent: Dec. 10, 2013

(54) METER SOCKET ASSEMBLY

(75) Inventors: Duan Earl Packard, III, Sherman, TX (US); Jonathan Keith Baillio, Sherman, TX (US)

(73) Assignee: Cooper Technologies Company, Houston, TX (US)

( * ) Notice: Subject to any disclaimer, the term of this patent is extended or adjusted under 35 U.S.C. 154(b) by 334 days.

(21) Appl. No.: 13/030,741

(22) Filed: Feb. 18, 2011

(65) Prior Publication Data
US 2012/0214334 A1 Aug. 23, 2012

(51) Int. Cl.
H01R 33/945 (2006.01)

(52) U.S. Cl.
USPC ........................................ 439/517; 439/746

(58) Field of Classification Search
USPC .............. 439/517, 594, 682, 717, 733.1, 857, 439/744, 745, 746
See application file for complete search history.

(56) References Cited

U.S. PATENT DOCUMENTS

| | | | |
|---|---|---|---|
| 2,931,879 A | 4/1960 | Waldrop | |
| 3,131,984 A * | 5/1964 | Kobryner | 439/167 |
| 3,221,216 A * | 11/1965 | Kobryner | 361/704 |
| 3,394,340 A | 7/1968 | Kobryner | |
| 3,628,097 A | 12/1971 | Kobryner | |
| 3,731,253 A | 5/1973 | Coffey | |
| 3,735,332 A | 5/1973 | Tirrell | |
| 4,104,588 A * | 8/1978 | Westberry | 324/110 |
| 5,774,317 A | 6/1998 | Allina | |
| 6,549,388 B2 | 4/2003 | Robinson | |
| 6,561,844 B1 * | 5/2003 | Johnson | 439/507 |
| 6,592,399 B2 | 7/2003 | Robinson et al. | |
| 6,931,893 B2 | 8/2005 | Agbay | |
| 7,142,412 B2 * | 11/2006 | Witherbee et al. | 361/662 |
| 7,291,042 B2 * | 11/2007 | Johnson | 439/517 |
| 7,503,800 B2 * | 3/2009 | Siglock et al. | 439/517 |
| 7,559,793 B1 | 7/2009 | Zhang et al. | |
| 7,614,908 B2 * | 11/2009 | Zhang | 439/517 |
| 7,621,775 B1 * | 11/2009 | Michaud et al. | 439/517 |
| 7,850,483 B2 * | 12/2010 | Siglock et al. | 439/517 |
| 8,040,664 B2 * | 10/2011 | Makinson et al. | 361/661 |
| 8,218,295 B1 * | 7/2012 | Shoemaker et al. | 361/668 |
| 2001/0021605 A1 | 9/2001 | Bolam | |
| 2009/0247005 A1 | 10/2009 | Zhang et al. | |
| 2010/0323555 A1 * | 12/2010 | Geiger et al. | 439/517 |
| 2012/0214334 A1 * | 8/2012 | Packard et al. | 439/517 |

* cited by examiner

Primary Examiner — Neil Abrams
Assistant Examiner — Travis Chambers
(74) Attorney, Agent, or Firm — Senniger Powers LLP

(57) ABSTRACT

An electric meter socket assembly for connecting an electric meter to a power line. An electrically non-conductive meter base includes a terminal for connecting a power line to the base. The base also includes a track and an opening positioned along the track. An auxiliary jaw mount has a portion sized and shaped to engage the track and to prevent the mount from moving in a direction perpendicular to the track. The mount has an opening that is aligned with the opening in the base. An auxiliary jaw element has a flexible prong sized and spaced for insertion through the opening in the mount and into the opening in the base. The prong prevents the mount from moving from a predetermined position along the track. The prong includes a barb positioned to engage the mount and/or the base.

19 Claims, 9 Drawing Sheets

METER SOCKET ASSEMBLY

FIELD OF THE INVENTION

The present invention generally relates to electric meter sockets, and more specifically to electric meter sockets requiring fewer fasteners.

BACKGROUND OF THE INVENTION

Meters are used to measure electricity usage. For example, a meter may be connected to power lines entering a building to measure electricity usage in the building. A meter socket mounted on the building is used to connect the meter to the power lines. The meter socket includes a non-conductive base having a plurality of terminals to which the power lines are connected. The base also has a jaw contact corresponding to each terminal for receiving blade connectors extending from the electric meter. The base also includes a bracket for mounting the socket.

Conventional meter sockets have two bases mounted to each bracket. Two or more threaded fasteners connect each base to the bracket. Each fastener opening increases assembly and hardware cost.

A typical meter base has four terminals for connecting power lines carrying up to 600 volts. Five terminals are needed for 120/208V service or other applications. In order to minimize manufacturing cost, meter bases having four terminals are sold. When a fifth terminal is required, a terminal and jaw assembly is connected to the base. The assemblies are mounted on the base using two or more screw fasteners, increasing costs as described above. Conventionally, bases include a raised mount surface for mounting the terminal and jaw assembly. The mount surface increases material needed for the base, increasing manufacturing cost. As will be appreciated by those skilled in the art, there is a continuing need to reduce material, manufacturing, and assembly expenses of meter sockets.

SUMMARY OF THE INVENTION

In one aspect, the present invention is directed to an electric meter socket assembly for connecting an electric meter to a power line. The assembly comprises an electrically non-conductive meter base including a terminal for connecting a power line to the base and a primary jaw contact electrically connected to the terminal for releasably receiving a primary blade connector of the electric meter to electrically connect the primary blade connector of the electric meter to the power line. The meter base also includes a track and an opening positioned along the track. The assembly further comprises an auxiliary jaw mount having a portion sized and shaped to engage the track and to prevent the mount from moving in a direction perpendicular to the track when engaged with the track. The mount has an opening that is aligned with the opening in the meter base when the portion of the mount is in a predetermined position along the track. In addition, the assembly includes an auxiliary jaw element having an auxiliary jaw contact for releasably receiving an auxiliary blade connector of the electric meter. The auxiliary jaw element includes a flexible prong extending from the auxiliary jaw contact sized and spaced for insertion through the opening in the auxiliary jaw mount and into the opening in the meter base. The prong prevents the auxiliary jaw mount from moving from the predetermined position along the track when the prong is inserted through the opening in the auxiliary jaw mount and into the opening in the meter base. The prong engages at least one of the auxiliary jaw mount and the meter base when the prong is inserted through the opening in the auxiliary jaw mount and into the opening in the meter base to prevent the prong from being removed from the opening in the meter base to prevent the auxiliary jaw mount from moving from the predetermined position along the track without disengaging the prong from the at least one of the auxiliary jaw mount and the meter base and removing the prong from the opening in the meter base.

In another aspect, the present invention includes an auxiliary jaw assembly for mounting on an electric meter socket base to receive an auxiliary jaw contact of an electric meter. The jaw assembly comprises an electrically non-conductive auxiliary jaw mount adapted to engage the electric meter socket base. The mount has an opening through it. The assembly also comprises an auxiliary jaw element having an auxiliary jaw contact for releasably receiving an auxiliary blade connector of the electric meter and a terminal electrically connected to the auxiliary jaw contact for connecting a power line to the auxiliary blade connector. In addition, the assembly comprises a prong extending from the auxiliary jaw contact sized and shaped for insertion through the opening in the auxiliary jaw mount and into an opening in the meter base when the auxiliary jaw mount is in a predetermined position on the meter base.

In still another aspect, the present invention includes an electric meter socket assembly for connecting an electric meter to a power line. The socket assembly comprises a socket base bracket including a mount surface having an opening for receiving a fastener. The assembly also includes an electrically non-conductive meter base including a base surface adapted to engage the mount surface of the socket base bracket. A terminal mounted on the meter base connects a power line to the base, and a primary jaw contact electrically connected to the terminal releasably receives a primary blade connector of the electric meter to electrically connect the primary blade connector of the electric meter to the power line. In addition, the assembly comprises a fastener sized and shaped for receipt in the bracket opening to fasten the meter base to the bracket. Further, the assembly includes a positioning element provided on the meter base and/or the base bracket for preventing the meter base from rotating relative to the base bracket when the base is fastened to the bracket and the base surface of the meter base engages the mount surface of the bracket.

In yet another aspect, the present invention includes a method of assembling a meter socket. A flange of a base bracket is inserted into a slot in a meter base. A base surface of the meter base is engaged with a mount surface of the base bracket. The base surface of the meter base is fastened to the mount surface of the base bracket when the flange of base bracket is in the slot in the meter base.

In still another aspect, the present invention includes a method of assembling a meter socket. An auxiliary jaw mount is slid into a track on an electric meter socket base. A prong of an auxiliary jaw element is inserted through a hole in the auxiliary jaw mount and into an opening in the socket base when the mount is slid into the track on the socket base. The prong flexes so a barb on the prong of the auxiliary jaw element engages with the auxiliary jaw mount to prevent the prong from being withdrawn from the opening in the socket base.

Other objects and features will be in part apparent and in part pointed out hereinafter.

BRIEF DESCRIPTION OF THE DRAWINGS

Corresponding reference characters indicate corresponding parts throughout the drawings.

DESCRIPTION OF THE PREFERRED EMBODIMENTS

Figure 1:
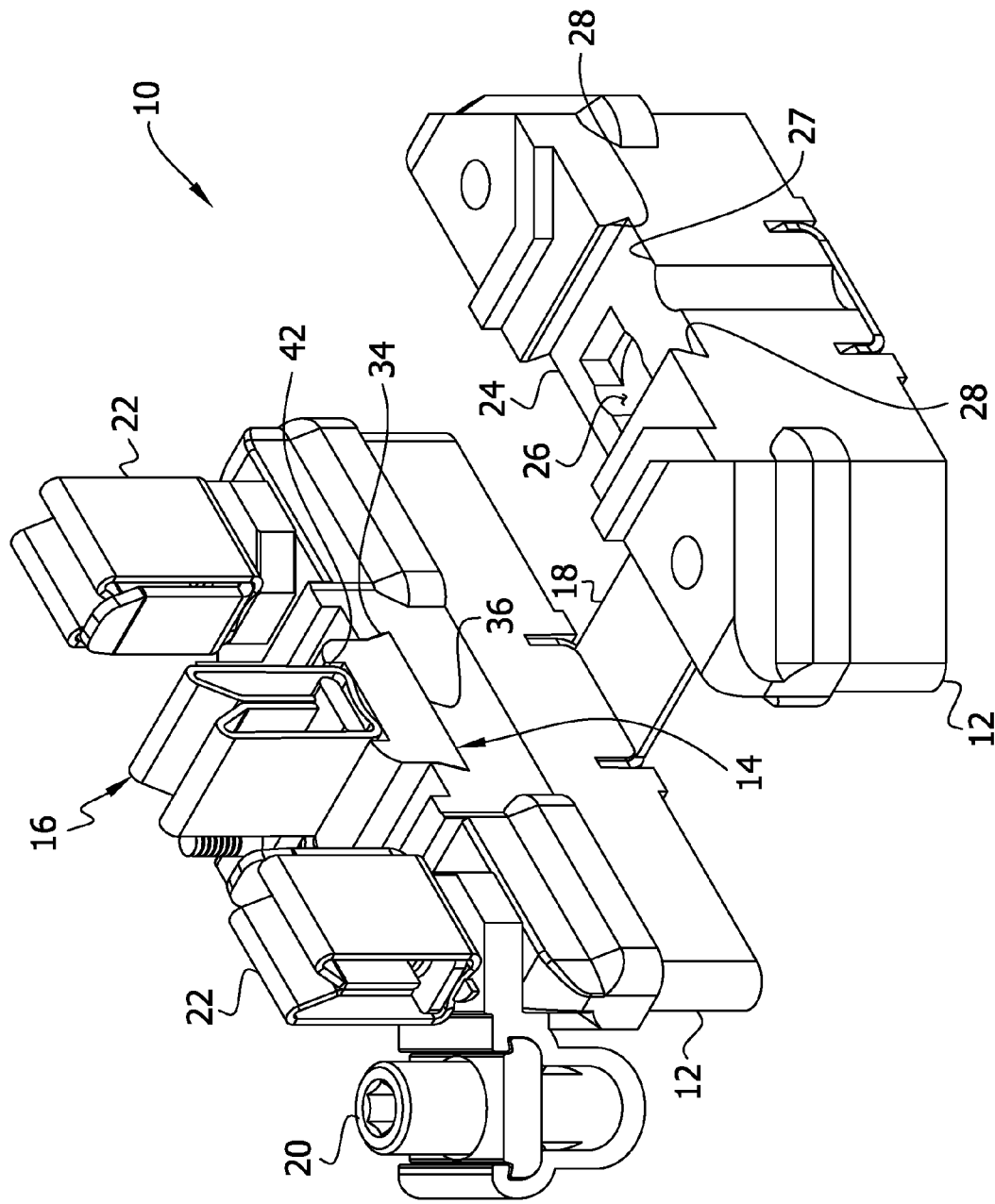
FIG. 1 is a perspective of a meter socket assembly according to the present invention showing two primary contact jaws removed for clarity.

Referring to FIG. 1, an electric meter socket assembly of one embodiment of the present invention is generally designated in its entirety by the reference number 10. As will be understood by those skilled in the art, the socket assembly 10 is used to connect an electric utility meter to power lines. The socket assembly 10 includes a meter base 12, which electrically insulates the electric meter and power lines from a back wall of an enclosure (not shown) in which the socket assembly is mounted. In some embodiments, the socket assembly 10 also includes an auxiliary jaw mount, generally designated by 14, and a jaw assembly, generally designated by 16, which are used to adapt the socket assembly for connection to a neutral power line. Although the jaw assembly 16 is illustrated as an assembled group of components, it is envisioned that in some embodiments, the jaw assembly could be formed as a single component. Thus, the jaw assembly will be referred to more broadly as a jaw element. In most instances, the socket assembly 10 also includes a socket base bracket 18 for mounting the assembly. As illustrated in FIG. 1, the socket base bracket 18 usually holds two meter bases 12 to create a four or five terminal socket assembly as generally known in the art.

The meter base 12 is preferably made of an electrically non-conductive material. In some embodiments, the base 12 is molded from VALOX 420 SEG thermoplastic resin, but other manufacturing processes and materials known in the art may be used without departing from the scope of this invention. VALOX is a federally registered U.S. trademark of Sabic Innovative Plastics IP B.V. Co. of the Netherlands. The meter base 12 includes electrically conductive terminals 20 for connecting power lines to the base. An electrically conductive primary jaw contact 22 is electrically connected to each terminal 20 and positioned on the base 12 to receive a primary blade connector of an electric meter. Although the terminals 20 and jaw contacts 22 may be made of other materials without departing from the scope of the present invention, in one embodiment they are made of a copper alloy. Because electrical meter blade connectors, power lines, and their method of connection are conventional, they will not be described in further detail. In the illustrated embodiment, each meter base 12 includes two terminals 20 for connecting two corresponding primary blade connectors of an electric meter to the socket 10.

Figure 5:
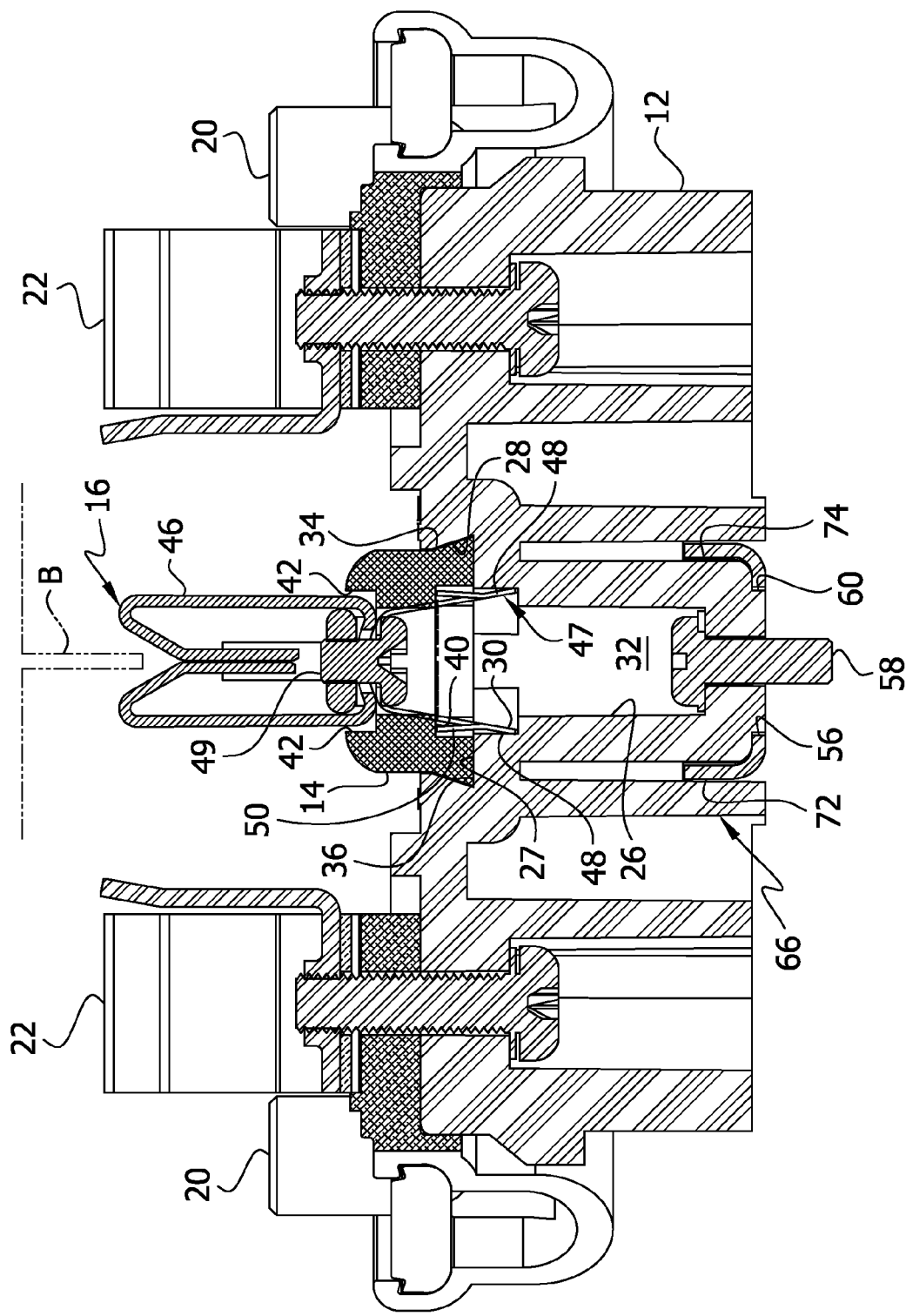
FIG. 5 is a cross section of the meter socket assembly taken along line 5-5 of FIG. 2.
Figure 6:
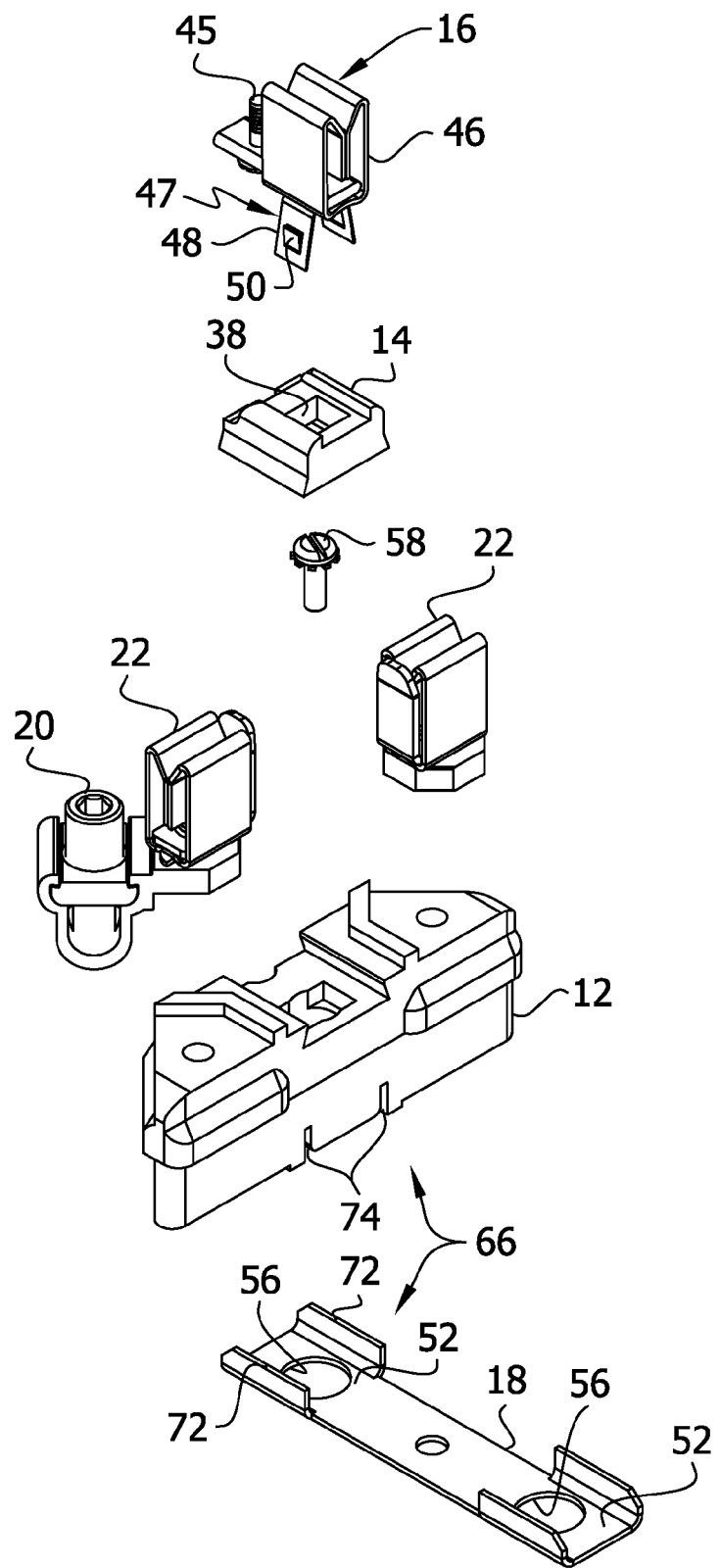
FIG. 6 is a separated perspective of the meter socket assembly.

As further illustrated in FIG. 1, each meter base 12 includes a dovetail-shaped track 24 and an opening (e.g., a hole) 26 positioned along the track. The track 24 is shown positioned between the two terminals 20, but other configurations may be used without departing from the scope of the present invention. In the illustrated embodiment, the track 24 is defined by a bottom surface 27 and two angled side surfaces 28. The opening 26 extends completely through the meter base 12. As shown in FIGS. 1, 5, and 6, the opening 26 does not have a uniform cross section. The opening 26 varies in shape along its length, from a generally rectangular portion 30 near the top of meter base 12 to a generally circular portion 32 near the bottom of the meter base.

Figure 2:
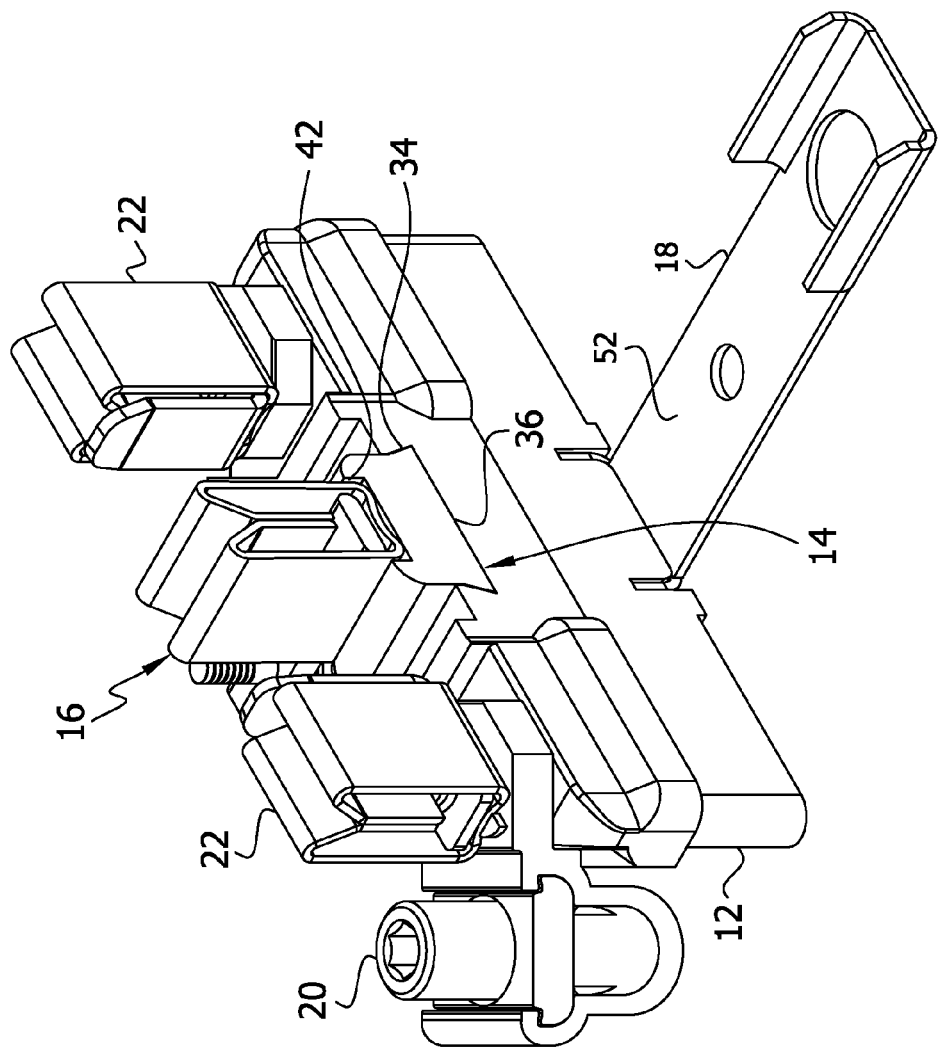
FIG. 2 is a perspective of a partially assembled meter socket assembly.

Referring to FIGS. 1 and 2, the electrically non-conductive auxiliary jaw mount 14 includes a portion that is sized and shaped to engage the track 24. In some embodiments, the mount 14 is molded from VALOX 420 SEG thermoplastic resin, but other manufacturing processes and materials known in the art may be used without departing from the scope of this invention. The auxiliary jaw mount 14 includes opposite side surfaces 34 that are angled similarly to the side surfaces 28 of the base 12 and a bottom surface 36. The side surfaces 34 are spaced farther from one another at a first position near the bottom surface 36 of the auxiliary jaw mount 14 than at a second position spaced farther from the bottom surface of the mount. The opposite side surfaces 34 of the mount 14 engage the angled surfaces 28 of the track 24, and the bottom surface of the mount engages the bottom surface 27 of the track as shown in FIG. 5. As will be apparent to those skilled in the art, the track 24 allows the mount 14 to move along the track but prevents the mount from moving in a direction perpendicular to the track when the mount is engaged with the track.

The mount 14 has an opening 38 extending through it as shown in FIGS. 4-6 and 8. As the mount 14 slides into position along the track 24, the opening 38 moves into alignment with the opening 26 in the meter base. In the illustrated embodiment, the opening 38 in the auxiliary jaw mount 14 is rectangular, and has an undercut 40 as shown in FIG. 5. The opening 38 is configured to receive the auxiliary jaw element 16, as will be described below. In some embodiments, the mount 14 includes an orientation feature 42 to position the jaw element 16 and prevent it from rotating when the jaw element is attached to the auxiliary jaw mount. In the illustrated embodiment, the orientation feature 42 includes opposing guide surfaces 44 extending from the mount 14 as shown in FIGS. 2 and 5.

The auxiliary jaw element 16 includes a terminal 45 for connecting a power line (e.g., a neutral line) to the element and an auxiliary jaw contact 46 for receiving an auxiliary blade connector of an electric meter, as is known in the art. The terminal 45 and jaw 46 are electrically connected to communicate power between a power line (not shown) connected to the terminal 45 and a blade connector B (FIG. 5).

Figure 4:
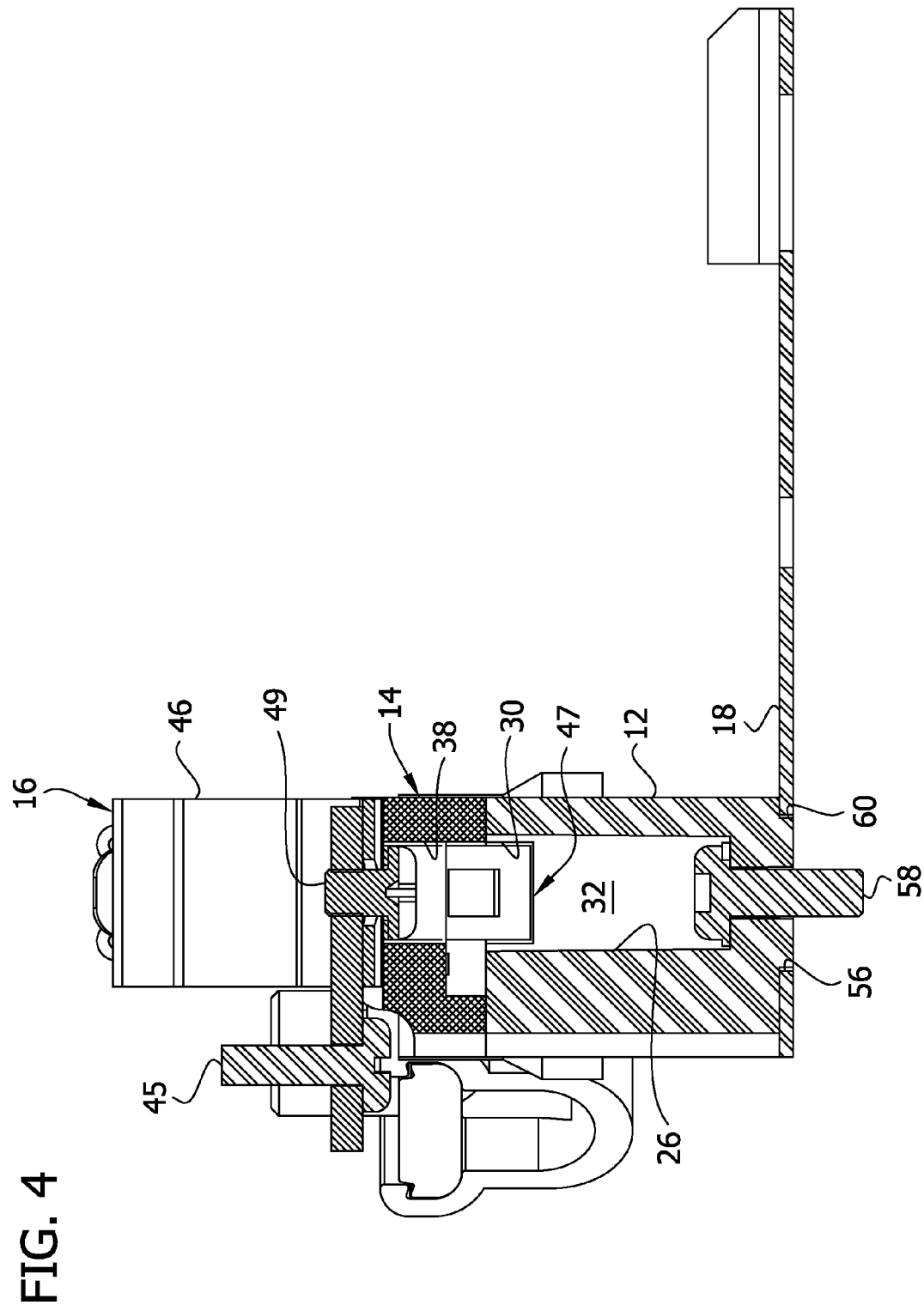
FIG. 4 is a cross section of the meter socket assembly taken along line 4-4 of FIG. 2.
Figure 9:
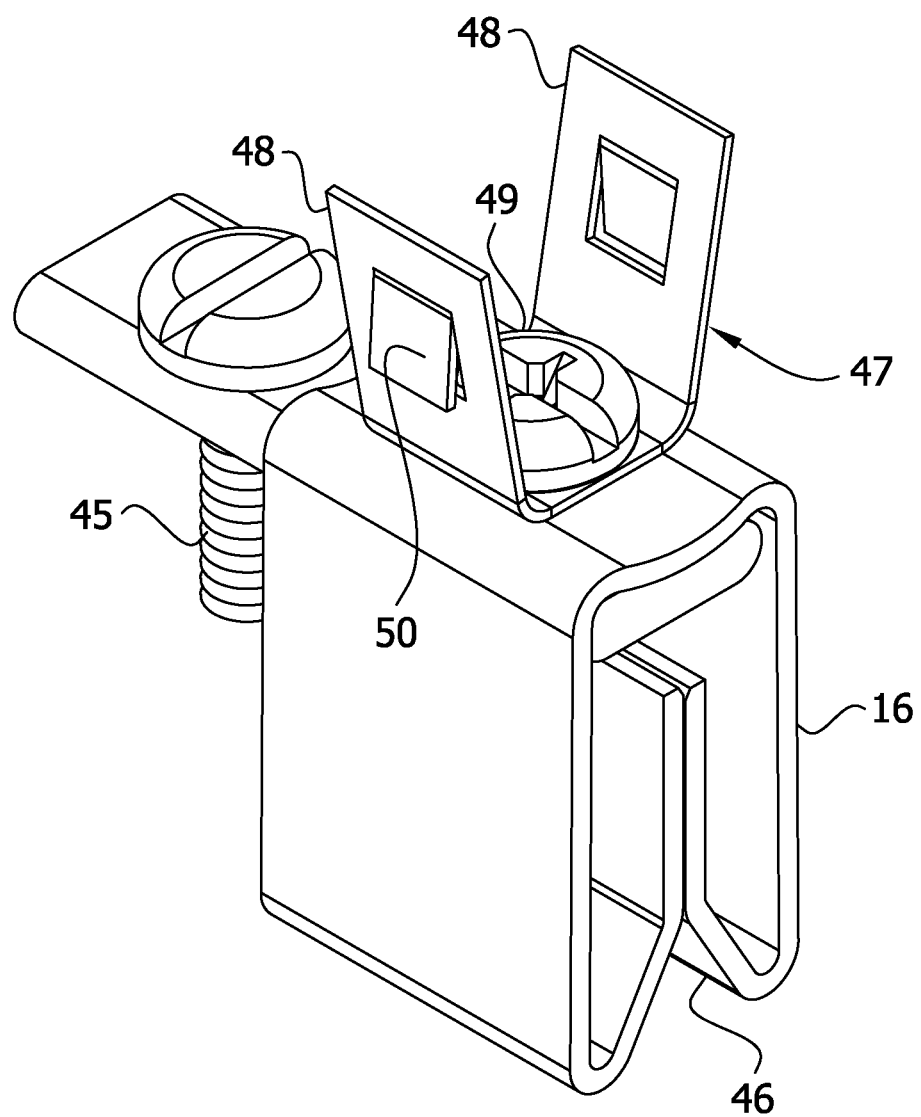
FIG. 9 is a bottom perspective of an auxiliary jaw element.

As illustrated in FIG. 9, the jaw element 16 also includes a snap fastener, generally designated by 47. In one embodiment, the snap fastener 47 comprises a flexible prong 48 connected to the jaw contact 46 by a screw fastener 49. The illustrated jaw element 16 includes two prongs 48 that are biased away from each other and toward engagement with the mount 14 or the base 12. The prongs 48 are sized and shaped to be inserted through the opening 38 in the mount 14 and into the opening 26 in the base 12 as shown in FIGS. 4 and 5. When the prongs 48 are inserted into both openings 38, 26, the prongs prevent the mount 14 from moving along track 24 in base 12. Each prong 48 includes a barb 50 that extends outward to engage either the mount 14 or the base 12 when the prong is inserted through the openings 38, 26. The barbs 50 prevent the prongs 48 from being removed from the openings 38, 26, and prevent the mount 14 from moving along the track 24 without first disengaging the barbs and removing the prongs from the openings. As shown in FIG. 5, each prong 48 engages the rectangular portion 30 of the opening 26, and each barb 50 engages the undercut 40 of opening 38. Those skilled in the art will appreciate that the snap fastener 47 has advantages over screw fasteners. For example, the snap fastener 47 provides the auxiliary jaw element 16 with a self-contained fastener that cannot become separated from the auxiliary jaw element, and the snap fastener does not require tools for installation.

Figure 3:
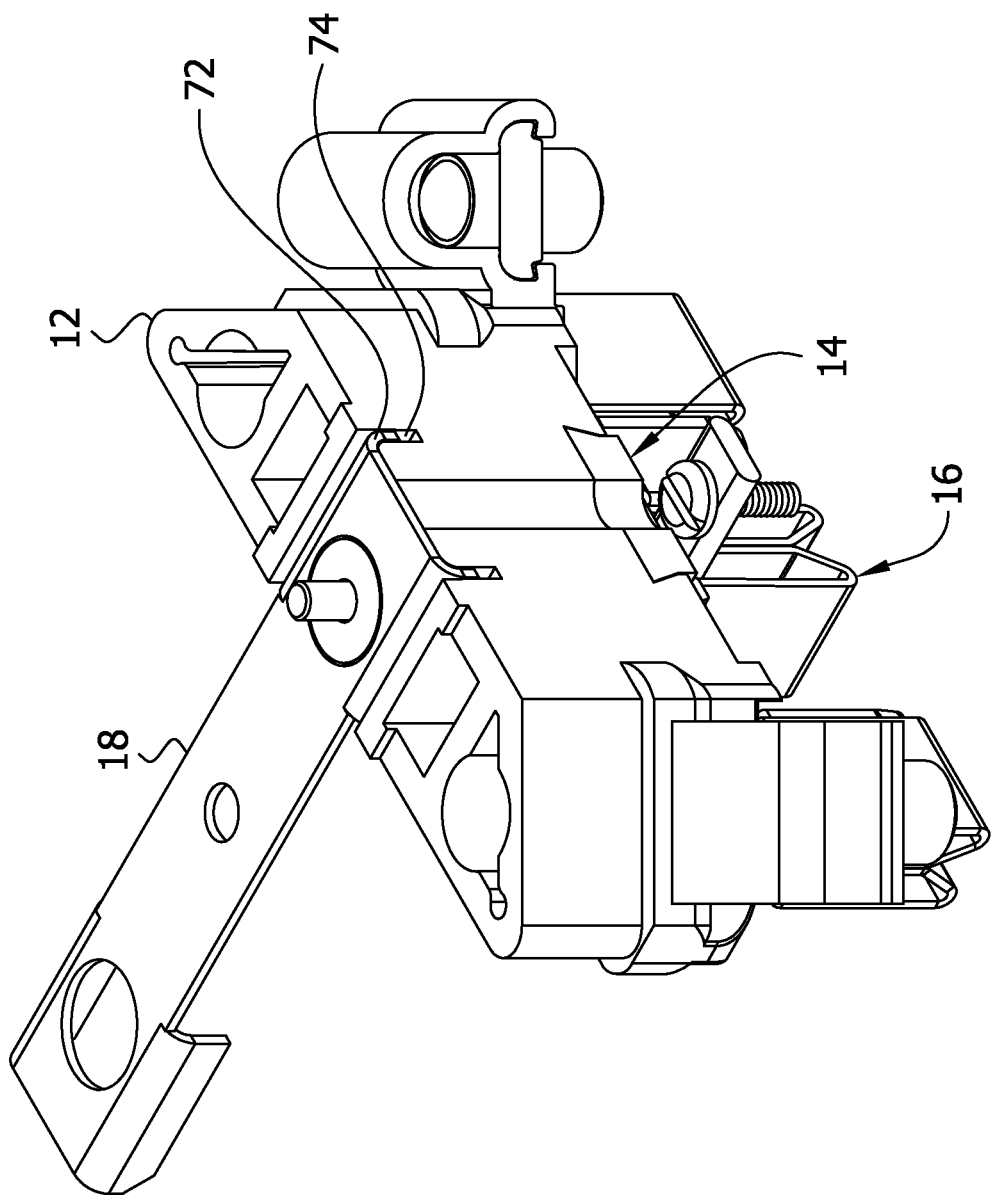
FIG. 3 is a bottom perspective thereof.
Figure 7:
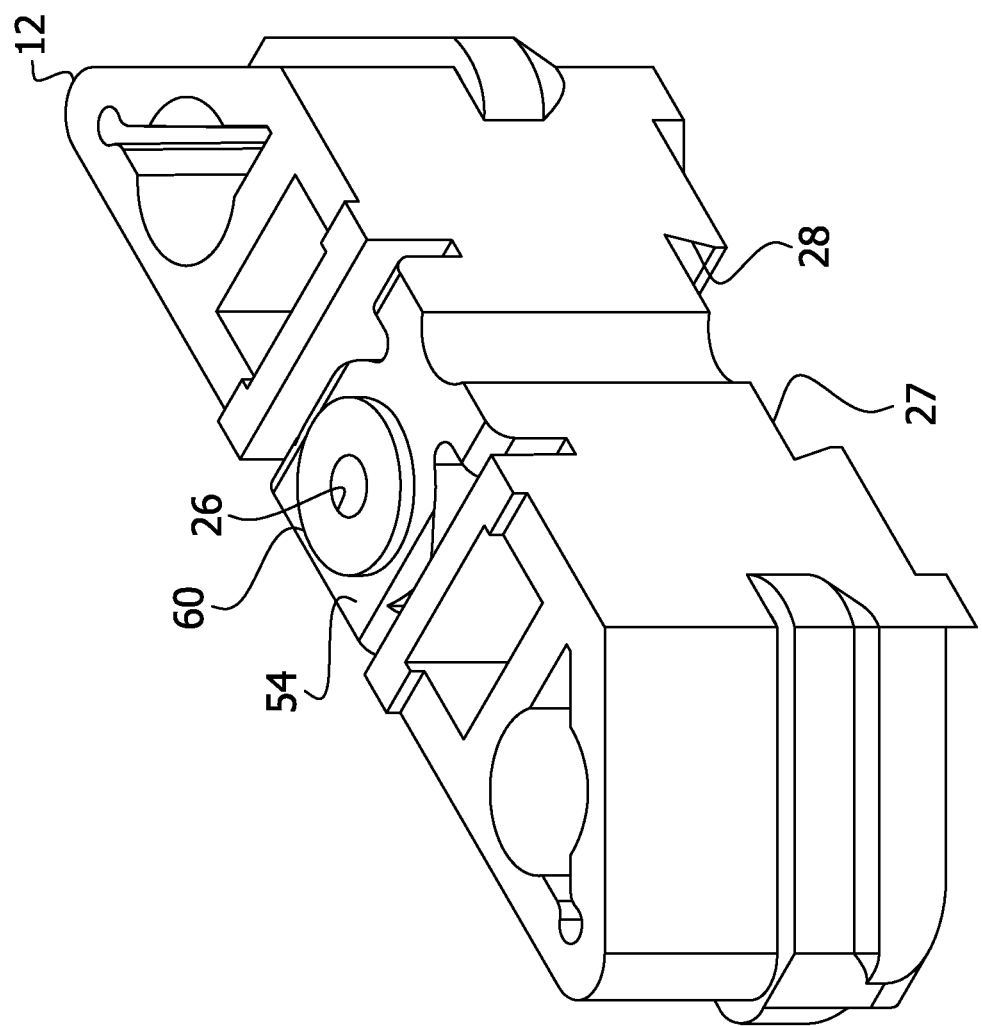
FIG. 7 is a bottom perspective of a meter base.
Figure 8:
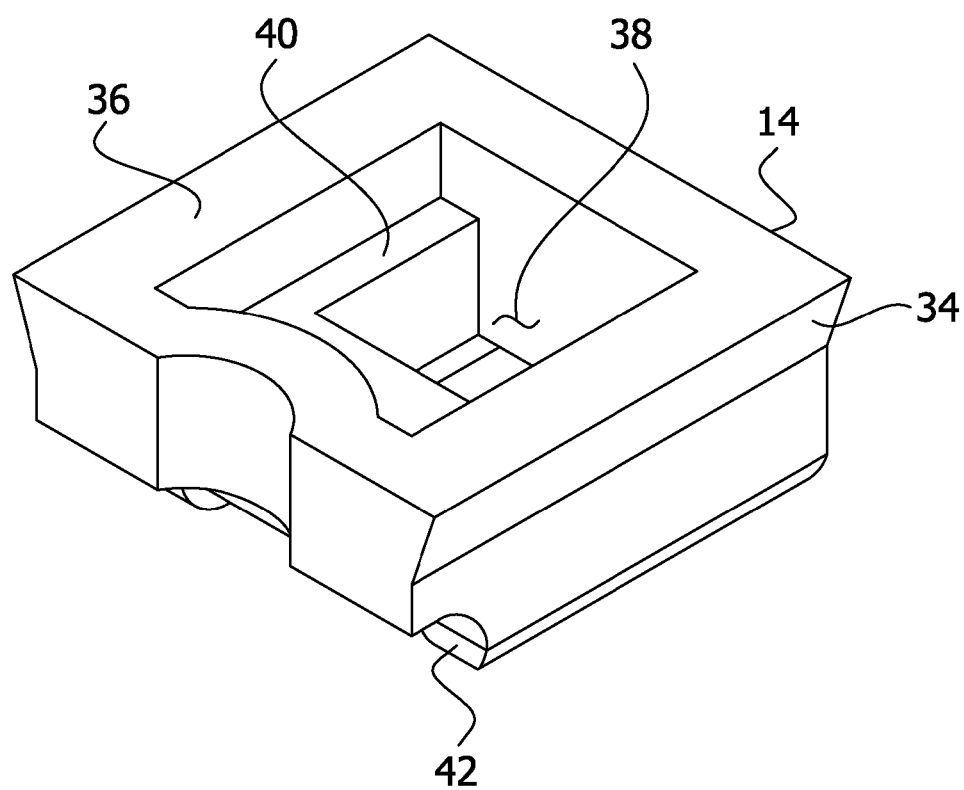
FIG. 8 is a bottom perspective of an auxiliary jaw mount.

As shown in FIGS. 2, 3, and 6, the socket base bracket 18 has a mount surface 52 that engages a base surface 54 of meter base 12 when assembled. An opening 56 extends through the mount surface 52 of the bracket 18. A fastener 58 is inserted in the opening 26 of the meter base 12 and through the opening 56 of the mount surface 52 to fasten the meter base to the bracket 18. As illustrated in FIGS. 4 and 5, the fastener 58 is secured to a back wall of an enclosure (not shown). The base surface 54 of the meter base 12 includes a boss 60 surrounding the opening 26 as shown in FIG. 7. The opening 56 in the bracket 18 is sized and shaped to receive the boss 60. Although the bracket 18 may be made of other materials and using other processes without departing from the scope of the present invention, in one embodiment the bracket is punched from 16 gauge galvanized steel sheet.

Referring to FIG. 6, the meter socket assembly 10 also includes a positioning element 66 adapted to prevent the meter base 12 from rotating relative to the base bracket 18 when the base is fastened to the bracket with the base surface 54 engaging the mount surface 52. The positioning element 66 includes protrusions, such as flanges 72, extending from each edge of the mount surface 52, as illustrated in FIG. 6, and corresponding slots 74 in the base surface for receiving the flanges. As shown in FIG. 3, each slot 74 receives a flange 72 when the base 12 is mounted on the bracket 18 to prevent the base from rotating on the bracket. In some embodiments, fewer or more flanges and slots may be used.

The meter socket assembly 10 is assembled by inserting the flange 72 of the base bracket 18 into the slot 74 in the base 12. The base surface 54 of the base 12 is engaged with and fastened to the mount surface 52 of the bracket 18. The fastener 58 is inserted through the opening 26 in the base 12 and the opening 56 in the bracket 18 to secure the base to the bracket. In those applications when a fifth jaw contact is required, the auxiliary jaw mount 14 is slid into the track 24 on the base 12, and the prongs 48 of the jaw element 16 are inserted through the opening 38 in the mount and into the opening 26 in the base. As the prongs 48 are inserted into the openings 38, 26, the barbs 50 on the prongs engage the mount 14 to prevent the prongs from being withdrawn from the opening in base 12. Some of the features described above reduce assembly time and labor cost. Further, these features reduce the number of fasteners used and the amount of material needed in some configurations, thereby reducing manufacturing and material costs.

Having described the invention in detail, it will be apparent that modifications and variations are possible without departing from the scope of the invention defined in the appended claims.

When introducing elements of the present invention or the preferred embodiments(s) thereof, the articles "a", "an", "the", and "said" are intended to mean that there are one or more of the elements. The terms "comprising", "including", and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. An electric meter socket assembly for connecting an electric meter to a power line, the assembly comprising:
   an electrically non-conductive meter base including a terminal for connecting a power line to the base and a primary jaw contact electrically connected to the terminal for releasably receiving a primary blade connector of the electric meter to electrically connect the primary blade connector of the electric meter to the power line, the meter base further including a track and an opening positioned along the track;
   an auxiliary jaw mount having a portion sized and shaped to engage the track and to prevent the auxiliary jaw mount from moving in a direction perpendicular to the track when engaged with the track, the auxiliary jaw mount having an opening that is aligned with the opening in the meter base when the portion of the auxiliary jaw mount is in a predetermined position along the track; and
   an auxiliary jaw element having an auxiliary jaw contact for releasably receiving an auxiliary blade connector of the electric meter, the auxiliary jaw element including a flexible prong extending from the auxiliary jaw contact sized and spaced for insertion through the opening in the auxiliary jaw mount and into the opening in the meter base, the prong preventing the auxiliary jaw mount from moving from the predetermined position along the track when the prong is inserted through the opening in the auxiliary jaw mount and into the opening in the meter base, the prong engaging at least one of the auxiliary jaw mount and the meter base when the prong is inserted through the opening in the auxiliary jaw mount and into the opening in the meter base to prevent the prong from being removed from the opening in the meter base to prevent the auxiliary jaw mount from moving from the predetermined position along the track without disengaging the prong from the at least one of the auxiliary jaw mount and the meter base and removing the prong from the opening in the meter base.

2. An electric meter socket assembly as set forth in claim 1, wherein the portion of the auxiliary jaw mount sized and shaped to engage the track comprises opposing side surfaces of the auxiliary jaw mount, the opposing side surfaces being spaced farther from one another at a first position closer to a bottom surface of the auxiliary jaw mount than the opposing side surfaces are spaced from one another at a second position farther from the bottom surface of the auxiliary jaw mount.

3. An electric meter socket assembly as set forth in claim 1, wherein the prong includes a barb positioned to engage at least one of the auxiliary jaw mount and the meter base when the prong is inserted through the opening in the auxiliary jaw mount and into the opening in the meter base to prevent the prong from being removed from the opening in the meter base to prevent the auxiliary jaw mount from moving from the predetermined position along the track without disengaging the barb from the at least one of the auxiliary jaw mount and the meter base and removing the prong from the opening in the meter base.

4. An electric meter socket assembly as set forth in claim 3, wherein the barb is positioned to engage the auxiliary jaw mount.

5. An electric meter socket assembly as set forth in claim 3, wherein:
the opening in the auxiliary jaw mount has an undercut; and
the barb is positioned to engage the undercut in the opening of the auxiliary jaw mount.

6. An electric meter socket assembly as set forth in claim 3, wherein auxiliary jaw element has two prongs biased toward engagement with the at least one of the auxiliary jaw mount or the meter base.

7. An electric meter socket assembly as set forth in claim 1, wherein the auxiliary jaw mount further comprises an orientation feature to position the jaw element and prevent it from rotating when the jaw element is attached to the auxiliary jaw mount.

8. An electric meter socket assembly as set forth in claim 7, wherein the orientation feature comprises opposing guide surfaces extending from the auxiliary jaw mount.

9. An auxiliary jaw assembly for mounting on an electric meter socket base to receive an auxiliary jaw contact of an electric meter, the jaw assembly comprising:
an electrically non-conductive auxiliary jaw mount adapted to engage the electric meter socket base, the auxiliary jaw mount having an opening therethrough; and
an auxiliary jaw element having an auxiliary jaw contact for releasably receiving an auxiliary blade connector of the electric meter, a terminal electrically connected to the auxiliary jaw contact for connecting a power line to the auxiliary blade connector, and a flexible prong extending from the auxiliary jaw contact sized and shaped for insertion through the opening in the auxiliary jaw mount and into an opening in the meter base when the auxiliary jaw mount is in a predetermined position on the meter base.

10. An auxiliary jaw assembly as set forth in claim 9, wherein the auxiliary jaw mount includes opposing side surfaces that are spaced farther from one another at a first position closer to a bottom surface of the auxiliary jaw mount than the opposing side surfaces are spaced from one another at a second position farther from the bottom surface of the auxiliary jaw mount than the first position.

11. An auxiliary jaw assembly as set forth in claim 9, wherein the auxiliary jaw element has two prongs biased away from each other such that when the prongs are inserted into the auxiliary jaw mount, the prongs retain the jaw element in the auxiliary jaw mount.

12. An auxiliary jaw assembly as set forth in claim 9, wherein the prong includes a barb positioned to engage the auxiliary jaw mount when the prong is inserted into the auxiliary jaw mount.

13. An auxiliary jaw assembly as set forth in claim 9, wherein the auxiliary jaw mount further comprises an orientation feature to position the jaw element and prevent it from rotating when the jaw element is attached to the auxiliary jaw mount.

14. The auxiliary jaw assembly of claim 13, wherein the orientation feature comprises opposing guide surfaces extending from the auxiliary jaw mount.

15. An electric meter socket assembly for connecting an electric meter to a power line, the socket assembly comprising:
a socket base bracket including a mount surface having an opening for;
an electrically non-conductive meter base mounted on the socket base bracket, the meter base including a base surface engaging the mount surface of the socket base bracket, a terminal mounted on the meter base for connecting a power line to the base, a primary jaw contact electrically connected to the terminal for releasably receiving a primary blade connector of the electric meter to electrically connect the primary blade connector of the electric meter to the power line, and a boss extending from the base surface and received in the bracket opening, wherein the boss defines a boss opening;
a fastener received in the boss opening and extending through the bracket opening for fastening the meter base to the bracket; and
a positioning element provided on at least one of the meter base and the base bracket for preventing the meter base from rotating relative to the base bracket.

16. The electric meter socket assembly of claim 15 further comprising an auxiliary jaw assembly for mounting on the meter base, the jaw assembly including an electrically non-conductive auxiliary jaw mount adapted to engage the meter base, the auxiliary jaw mount having an opening therethrough, and an auxiliary jaw element having an auxiliary jaw contact for releasably receiving an auxiliary blade connector of the electric meter, a terminal electrically connected to the auxiliary jaw contact for connecting a power line to the auxiliary blade connector, and a snap fastener extending from the auxiliary jaw contact sized and spaced for insertion through the opening in the auxiliary jaw mount and into an opening in the meter base when the auxiliary jaw mount is in a predetermined position on the meter base.

17. The electric meter socket assembly of claim 15, wherein the positioning element comprises a protrusion extending from the mount surface of the base bracket.

18. The electric meter socket assembly of claim 17, wherein the positioning element comprises an opening in the meter base, wherein the bracket protrusion is received in the opening in the meter base.

19. The electric meter socket assembly of claim 18, wherein:
the protrusion extending from the mount surface of the base bracket comprises a flange formed on the bracket; and
the opening in the meter base in which the bracket protrusion is received comprises a slot sized and shaped for receiving the flange.

* * * * *